United States Patent
Lai et al.

(10) Patent No.: US 10,111,187 B2
(45) Date of Patent: Oct. 23, 2018

(54) RADIO-FREQUENCY POWER SUPPLY, RADIO-FREQUENCY AMPLIFIER AND METHOD FOR IMPROVING EFFICIENCY OF RADIO-FREQUENCY AMPLIFIER

(71) Applicant: DELTA ELECTRONICS, INC., Taoyuan (TW)

(72) Inventors: Wei-Hsun Lai, Taoyuan (TW); Chi Hsu, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 24 days.

(21) Appl. No.: 15/679,810

(22) Filed: Aug. 17, 2017

(65) Prior Publication Data

US 2018/0167898 A1 Jun. 14, 2018

(30) Foreign Application Priority Data

Dec. 13, 2016 (CN) .......................... 2016 1 1148469

(51) Int. Cl.
| | |
|---|---|
| *H04W 52/52* | (2009.01) |
| *H03F 1/30* | (2006.01) |
| *H02M 1/12* | (2006.01) |
| *H03F 1/02* | (2006.01) |
| *H03F 3/195* | (2006.01) |
| *H03G 3/30* | (2006.01) |
| *H04W 52/02* | (2009.01) |

(52) U.S. Cl.
CPC ............. *H04W 52/52* (2013.01); *H02M 1/12* (2013.01); *H03F 1/02* (2013.01); *H03F 1/30* (2013.01); *H03F 3/195* (2013.01); *H03G 3/3036* (2013.01); *H04W 52/0206* (2013.01)

(58) Field of Classification Search
CPC ........ H04B 2001/0416; H05B 33/0815; H03F 1/02; H04W 52/52
USPC .......................... 455/194.2, 193.1, 311, 341
See application file for complete search history.

(56) References Cited

U.S. PATENT DOCUMENTS

| | | | |
|---|---|---|---|
| 5,598,326 A | 1/1997 | Liu et al. | |
| 5,774,351 A | 6/1998 | Hsieh et al. | |
| 9,077,405 B2 * | 7/2015 | Jones ................... | H04B 1/0458 |
| 2003/0205990 A1 | 11/2003 | Wittenbreder, Jr. | |

(Continued)

OTHER PUBLICATIONS

Office Action dated Feb. 13, 2017 rom corresponding application No. TW 105141130.

*Primary Examiner* — John J Lee
(74) *Attorney, Agent, or Firm* — Hauptman Ham, LLP (57) ABSTRACT

A method for improving an efficiency of a radio-frequency amplifier includes following steps. A set of predetermined parameters are set. A total circuit parameter is calculated according to the set of the predetermined parameters. A switch stress of a power switch is calculated according to the set of the predetermined parameters and the total circuit parameter. A first curve graph is made according to a duty cycle corresponding to the switch stress. The efficiency is calculated according to the set of the predetermined parameters and the total circuit parameter. A second curve graph is made according to the duty cycle corresponding to the efficiency of the radio-frequency amplifier. A value of the duty cycle is selected according to the first curve graph. The efficiency corresponding to the value of the duty cycle is obtained according to the second curve graph.

16 Claims, 5 Drawing Sheets

(56) References Cited

U.S. PATENT DOCUMENTS

2013/0088078 A1* 4/2013 Shteynberg ........ H05B 33/0815
                                                    307/31
2015/0103953 A1* 4/2015 Lee ................... H04W 52/0251
                                                    375/297
2016/0330681 A1* 11/2016 Yang ................. H04W 52/0206

* cited by examiner

RADIO-FREQUENCY POWER SUPPLY, RADIO-FREQUENCY AMPLIFIER AND METHOD FOR IMPROVING EFFICIENCY OF RADIO-FREQUENCY AMPLIFIER

BACKGROUND OF THE INVENTION

Field of the Invention

The present invention relates to a radio-frequency power supply, a radio-frequency amplifier and a method for improving an efficiency of the radio-frequency amplifier, and especially relates to a radio-frequency power supply, a radio-frequency amplifier and a method for improving an efficiency of the radio-frequency amplifier which are designed by utilizing a radio-frequency amplifier circuit design process.

Description of the Related Art

Figure 1:
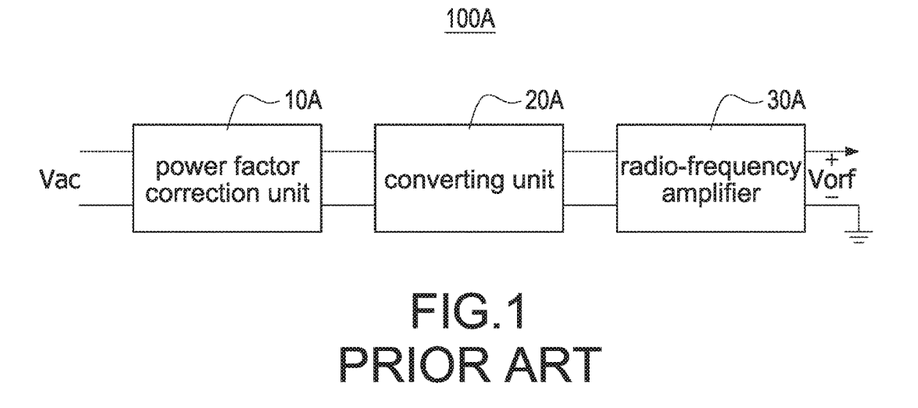
FIG. 1 shows a block diagram of the related art radio-frequency power supply.

In order to respond to the requirement of the government and the environmental protection unit that the semiconductor equipment manufacturers have to reduce the carbon emission in the next few years, improving the efficiency of the power supply is an important issue. FIG. 1 shows a block diagram of the related art radio-frequency power supply. A radio-frequency power supply 100A applied to the semiconductor equipment comprises a power factor correction unit 10A, a converting unit 20A and a radio-frequency amplifier 30A. The converting unit 20A is connected between the power factor correction unit 10A and the radio-frequency amplifier 30A, and converts an alternating current input voltage Vac into an output voltage Vorf.

Please refer to FIG. 1 again. The switching frequency of the third level radio-frequency amplifier 30A is the high frequency (400 kHz-40 MHz). The biggest problem and obstacle of the efficiency of the radio-frequency power supply 100A is the switching loss of the power switch (not shown in FIG. 1) of the radio-frequency amplifier 30A when switching. Therefore, in such high switching frequency, the circuit structure that can achieve zero voltage switching to reduce the switching loss is selected. The class D and E radio-frequency amplifiers 30A are the structures which are often used. Moreover, comparing with the class D radio-frequency amplifier, the class E radio-frequency amplifier uses the single arm switch to switch. Although the cost of the switching components and driving circuit of the class E radio-frequency amplifier 30A is lower, the internal components of the circuit of the class E radio-frequency amplifier 30A are more, so that when the output power is high (about 2000 W~3000 W), the power loss of the internal components of the circuit of the class E radio-frequency amplifier 30A and the conduction loss of the power switch is higher causing that the design of the class E radio-frequency amplifier 30A is complicated and the power application rate is low. Therefore, the class E radio-frequency amplifier 30A is still widely used in the application of the medium-low watts. The radio-frequency power supply applied to the class E radio-frequency amplifier mentioned above comprises following disadvantages:

1. The efficiency of the class E radio-frequency amplifier cannot be improved effectively. When the current class E radio-frequency amplifier is applied to the medium-high output power (about 2000 W~3000 W) and is in the high frequency switching (400 kHz~40 MHz), the power loss of the internal components of the class E radio-frequency amplifier is too large, so that the efficiency is low.

2. The power switch of the class E radio-frequency amplifier is selected by using the trial-and-error method. For the current method of adjusting the efficiency of the class E radio-frequency amplifier, most suitable power switches and circuit components are selected by using the trial-and-error method. First, the trial-and-error method is to maximize the cooling efficiency of the cooling system of the class E radio-frequency amplifier. After changing the power switch and the circuit components again and again, the efficiency of the class E radio-frequency amplifier is tested to adjust the efficiency of the class E radio-frequency amplifier. However, most of the highest efficiency after using the trial-and-error method is usually about only 80%.

3. There is not an effective circuit design process for the class E radio-frequency amplifier. Because the adjusting method for the current class E radio-frequency amplifier mostly is the trial-and-error method mentioned above, there is not an effective adjusting process for the circuit parameters. Therefore, adjusting the parameters of the power switch and the circuit components takes a lot of time.

Therefore, the inventors of the present invention would like to solve the problems mentioned above and design a radio-frequency power supply, a radio-frequency amplifier and its circuit design method, which are applied to the medium-high power (100~3000 W) and are able to maintain the high efficiency.

SUMMARY OF THE INVENTION

In order to solve the problems mentioned above, the present invention provides a method for improving an efficiency of a radio-frequency amplifier to overcome the related art problems. Therefore, the radio-frequency amplifier of the present invention comprises an input loop and an output loop. The input loop comprises an input inductor and a power switch. The input inductor is connected to the power switch in series. The output loop comprises an output capacitor and a resonant unit. The output capacitor is connected to the resonant unit in series. The power switch is connected to the output capacitor in parallel and converts an input voltage into an output voltage. The method for improving the efficiency of the radio-frequency amplifier comprises following steps: (a) Setting a set of predetermined parameters comprising an output power of the radio-frequency amplifier, the input voltage, an operation frequency and a duty cycle. (b) Calculating a total circuit parameter according to the set of the predetermined parameters. (c) Calculating a switch stress of the power switch according to the set of the predetermined parameters and the total circuit parameter. (d) Calculating the efficiency of the radio-frequency amplifier according to the set of the predetermined parameters and the total circuit parameter. (e) Determining whether the efficiency is within a predetermined range or not. If the efficiency is not within the predetermined range, the input voltage or the duty cycle of the set of the predetermined parameters is adjusted, and then the process returns to the step (a). If the efficiency of the radio-frequency amplifier is within the predetermined range, a value of the duty cycle is selected as a duty cycle of the power switch of the radio-frequency amplifier.

In an embodiment, the step (c) further comprises: (c1) Making a first curve graph according to the duty cycle corresponding to the switch stress.

In an embodiment, the step (d) further comprises: (d1) Making a second curve graph according to the duty cycle corresponding to the efficiency of the radio-frequency amplifier.

In an embodiment, the method further comprises following step after the step (d1): (d2) Selecting the value of the duty cycle according to the first curve graph, and obtaining the efficiency corresponding to the value of the duty cycle according to the second curve graph.

In an embodiment, the step (e) further comprises: (e1) Determining whether a total harmonic distortion and a cooling capacity of the radio-frequency amplifier are within the predetermined range or not. If the total harmonic distortion or the cooling capacity of the radio-frequency amplifier is not within the predetermined range, the input voltage or the duty cycle of the set of the predetermined parameters is adjusted, and then the process returns to the step (a). If the total harmonic distortion and the cooling capacity of the radio-frequency amplifier are within the predetermined range, the value of the duty cycle is selected as the duty cycle of the power switch of the radio-frequency amplifier.

In an embodiment, the total circuit parameter comprises a phase-shift angle of the radio-frequency amplifier, an electric capacity of the output capacitor, an input current of the radio-frequency amplifier and a resonant current of the resonant unit.

In an embodiment, the step (d) further comprises: (d2) Calculating a total power loss of the radio-frequency amplifier according to the set of the predetermined parameters and the total circuit parameter, and calculating the efficiency of the radio-frequency amplifier according to the total power loss. Moreover, the efficiency of the radio-frequency amplifier is equal to a ration of a power output of the radio-frequency amplifier relative to an overall power consumption of the radio-frequency amplifier.

In an embodiment, the resonant unit comprises a resonant capacitor and a resonant inductor. The resonant capacitor is connected to the resonant inductor in series. The step (d) further comprises: (d3) Selecting an inductance of the input inductor, a capacitance of the resonant capacitor and an inductance of the resonant inductor according to the total power loss.

In an embodiment, the switch stress comprises a switch voltage stress and a switch current stress.

In an embodiment, the step (c) further comprises: (c2) Selecting the power switch according to the switch voltage stress and the switch current stress.

In an embodiment, the total power loss comprises a power loss of the power switch, a power loss of the output capacitor, a power loss of the resonant unit and a power loss of the input inductor.

In order to solve the problems mentioned above, the present invention provides a radio-frequency amplifier to overcome the related art problems. Therefore, the radio-frequency amplifier of the present invention comprises an input loop and an output loop. The input loop comprises an input inductor and a power switch. The input inductor is connected to the power switch in series and receives an input voltage. The output loop comprises an output capacitor and a resonant unit. The output capacitor is connected to the power switch in parallel. The resonant unit is connected to the output capacitor in series and outputs an output voltage. Moreover, a duty cycle of the power switch of the radio-frequency amplifier is determined by the method for improving the efficiency of the radio-frequency amplifier mentioned above.

In an embodiment, the input voltage of the radio-frequency amplifier is the input voltage corresponding to the duty cycle of the power switch.

In order to solve the problems mentioned above, the present invention provides a radio-frequency power supply to overcome the related art problems. Therefore, the radio-frequency power supply of the present invention comprises a power factor correction unit, a converting unit, a radio-frequency amplifier and a control unit. The power factor correction unit converts an alternating current input voltage into a direct current voltage. The converting unit is connected to the power factor correction unit and converts the direct current voltage into an input voltage. The radio-frequency amplifier is connected to the converting unit and converts the input voltage into an output voltage. The control unit controls the power factor correction unit, the converting unit and the radio-frequency amplifier. Moreover, the radio-frequency amplifier comprises an input loop and an output loop. The input loop comprises an input inductor and a power switch. The input inductor is connected to the power switch in series. The output loop comprises an output capacitor and a resonant unit. The output capacitor is connected to the resonant unit in series. The power switch is connected to the output capacitor in parallel. A duty cycle of the power switch of the radio-frequency amplifier is determined by the method for improving the efficiency of the radio-frequency amplifier mentioned above.

In an embodiment, the input voltage of the radio-frequency amplifier is the input voltage corresponding to the duty cycle of the power switch.

In an embodiment, a voltage conversion ratio of the converting unit is adjusted according to the input voltage.

Please refer to the detailed descriptions and figures of the present invention mentioned below for further understanding the technology, method and effect disclosed by the present invention to achieve the predetermined purpose of the present invention. The purpose, features and characteristics of the present invention can be understood well and in details. However, the figures are only for references and descriptions, but the present invention is not limited by the figures.

DETAILED DESCRIPTION OF THE INVENTION

Please refer to following detailed description and figures for the technical content of the present invention.

Figure 2:
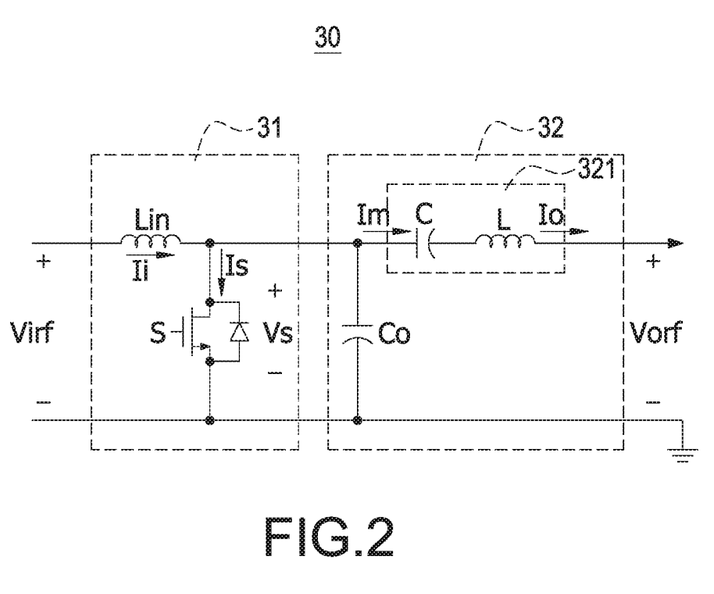
FIG. 2 shows a circuit diagram of the class E radio-frequency amplifier of the present invention.

FIG. 2 shows a circuit diagram of the class E radio-frequency amplifier of the present invention. A radio-frequency amplifier 30 converts an input voltage Virf into an output voltage Vorf. The radio-frequency amplifier 30 comprises an input loop 31 and an output loop 32. The input loop 31 comprises an input inductor Lin and a power switch S. The input inductor Lin is connected to the power switch S in series and receives the input voltage Virf. The output loop 32 comprises an output capacitor Co and a resonant unit 321. The output capacitor Co is connected to the power switch S in parallel. The resonant unit 321 is connected to the output capacitor Co in series. The resonant unit 321 comprises a resonant capacitor C and a resonant inductor L. One side of the resonant capacitor C is connected to the output capacitor Co. The resonant inductor L is connected to the other side of the resonant capacitor C. The output voltage Vorf is an alternating current voltage and is supplied to a back end load (not shown in FIG. 2) as the required power for the operation of the back end load. As shown in FIG. 2, a current outputted from the resonant unit 321 is an output current Io. According to the output voltage Vorf, the output current Io, a switch voltage stress Vs and a switch current stress Is of the power switch S, a power efficiency Pc of the radio-frequency amplifier 30 can be obtained. The power efficiency Pc is defined by an equation (1) shown below:

$$\text{Power efficiency} = \frac{\text{Output power}}{\text{switch voltage stress} \times \text{switch current stress}} \quad (1)$$

In order to have higher overall efficiency, a duty cycle D of the power switch S of the related art class E radio-frequency amplifier 30 is set as 0.5. In fact, when the power switch S is cut off, the input current Ii of the input inductor Lin and the output current Io flow into the output capacitor Co at the same time to form the switch voltage stress Vs between two sides of the power switch S. Therefore, the switch voltage stress Vs between the two sides of the power switch S of the radio-frequency amplifier 30 is related to the output current Io, so that the design is more complicated, and it is influenced by the back end load (not shown in FIG. 2) very much. Because the influence of high frequency parasitic parameters and parasitic resistances of the component itself, when being in the high output power (about 2000 W~3000 W), the parasitic resistances of the components of the input loop 31 and the output loop 32 of the radio-frequency amplifier 30 cause more power loss. Therefore, the resistance of the component itself and even the parasitic parameters have to be added and calculated in the process of calculating and optimizing the efficiency.

Figure 3:
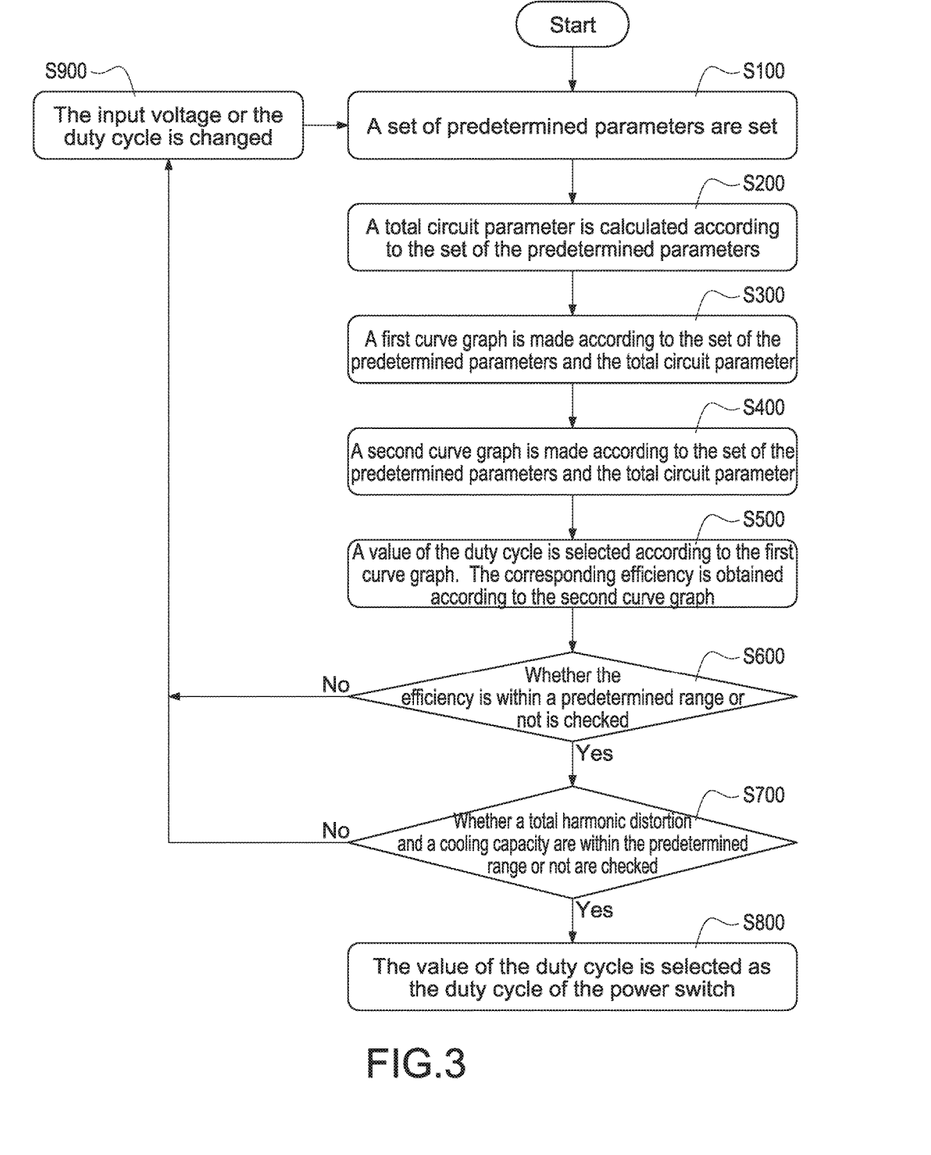
FIG. 3 shows a flow chart of the circuit design of the class E radio-frequency amplifier of the present invention.

FIG. 3 shows a flow chart of the circuit design of the class E radio-frequency amplifier of the present invention. Please refer to FIG. 2 again. The embodiment provides a circuit design process of the radio-frequency amplifier 30 that considers all components parameters, ensures the component stress does not exceed and is applied to the medium-high power (about 100~3000 W). According to the circuit design process of the radio-frequency amplifier 30, the components parameters most suitable for the radio-frequency amplifier 30 can be found to improve the overall efficiency of the radio-frequency amplifier 30. The internal components of the radio-frequency amplifier 30 comprise the input inductor Lin and the power switch S of the input loop 31, and the output capacitor Co and the resonant unit 321 of the output loop 32. In the circuit design process, an external operation unit (not shown in FIG. 2 or FIG. 3) calculates the components parameters of the radio-frequency amplifier 30. The design method (namely, the circuit design process) comprises following steps: First, a set of predetermined parameters are set. The set of the predetermined parameters comprises an output power of the radio-frequency amplifier, the input voltage, an operation frequency and a duty cycle (S100). In order to obtain the components parameters of the radio-frequency amplifier 30 having the optimized efficiency, a set of initial predetermined parameters P of the radio-frequency amplifier 30 have to be inputted into the operation unit. The set of the predetermined parameters P comprises the output power Po of the radio-frequency amplifier 30, the input voltage Virf, the operation frequency f and the duty cycle D of the power switch S. Then, a total circuit parameter is calculated according to the set of the predetermined parameters. The operation unit calculates a total circuit parameter Pa according to the set of the predetermined parameters P. The total circuit parameter Pa comprises a phase-shift angle φ of the radio-frequency amplifier 30, an electric capacity of the output capacitor Co, the input current Ii of the radio-frequency amplifier 30 and a resonant current Im of the resonant unit 321. The equations are as following (2)~(5):

$$\varphi := \operatorname{atan}\left[\frac{\cos(2\pi \cdot D) - 1}{2\pi \cdot (1 - D) + \sin(2\pi \cdot D)}\right] + \pi \quad (2)$$

$$Co := \frac{\left(Po \cdot (1-D)\cos(\pi D + \varphi)\begin{bmatrix}\pi \cdot (1-D)\cos(\pi D) + \\ \sin(\pi D)\end{bmatrix}\right)}{\omega \cdot Virf^2 \cdot \sin(\pi D + \varphi) \cdot \sin(\pi D)} \quad (3)$$

$$Ii := \frac{Virf}{\frac{(1-D)}{\omega \cdot Co} \cdot \frac{\pi(1-D) \cdot \cos(\pi D) + \sin(\pi D)}{\tan(\pi D + \varphi) \cdot \sin(\pi D)}} \quad (4)$$

$$Im := Ii \cdot \frac{2\pi \cdot (1-D)}{\cos(2\pi D + \varphi) - \cos(\varphi)} \quad (5)$$

Wherein the symbol w in the equations is the angular frequency. The selection of the electric capacity of the output capacitor Co is calculated and determined by the equation (3) mentioned above. Then, a first curve graph is made according to the set of the predetermined parameters and the total circuit parameter (S300). The operation unit calculates a switch stress Ss of the power switch S of the radio-frequency amplifier 30 according to the set of the predetermined parameters P and the total circuit parameter Pa calculated by the equations (2)~(5) mentioned above. The switch stress Ss comprises the switch voltage stress Vs and the switch current stress Is of the power switch S. The equations are as following (6)~(7):

$$Vs := \begin{cases} 0 \text{ if } 0 \leq \theta \leq 2\pi D \\ \frac{Virf \cdot \tan(\pi D + \varphi) \cdot \sin(\pi D)}{(1-D) \cdot [\pi \cdot (1-D)\cos(\pi D) + \sin(\pi D)]} \\ \left\{(\theta - 2\pi D) + \left[\frac{2\pi(1-D) \cdot (\cos(\theta + \varphi)) - \cos(2\pi D + \varphi)}{\cos(2\pi D + \varphi) - \cos(\varphi)}\right]\right\} \\ \text{if } 2\pi D \leq \theta \leq 2\pi \end{cases} \quad (6)$$

$$Is := \begin{vmatrix} Ii \cdot \left[1 - \frac{2\pi \cdot (1-D) \cdot \sin(\theta + \varphi)}{\cos(2\pi D + \varphi) - \cos(\varphi)}\right] \text{ if } 0 \leq \theta \leq 2\pi D \\ 0 \text{ if } 2\pi D \leq \theta \leq 2\pi \end{vmatrix} \quad (7)$$

Wherein the symbol θ in the equations is the angle. According to the equations (6)~(7), the power switch S suitable for the switch voltage stress Vs and the switch current stress Is can be selected. According to the variable duty cycle D calculated by the switch voltage stress Vs and the switch current stress Is calculated by the equations (6)~(7), the equations of a per unit switch voltage stress Vnor and a per unit switch current stress Inor are shown as following (8)~(9):

$$Vnor(D) := \frac{\tan(\pi D + \varphi(D)) \cdot \sin(\pi D)}{(1-D) \cdot [\pi \cdot (1-D)\cos(\pi D) + \sin(\pi D)]} \quad (8)$$

$$\left[(\omega_v(D) - 2\pi D) + \left[\frac{2\pi(1-D) \cdot \begin{pmatrix} \cos(\omega_v(D) + \varphi(D) + \varphi(D)) - \\ \cos(2\pi D + \varphi(D)) \end{pmatrix}}{\cos(2\pi D + \varphi(D)) - \cos(\varphi(D))}\right]\right]$$

$$Inor(D) := \left[1 - \frac{2\pi \cdot (1-D)\sin(\omega_i(D) + \varphi(D))}{\cos(2\pi D + \varphi(D)) - \cos(\varphi(D))}\right] \quad (9)$$

Wherein the symbols ωv(D) and ωi(D) in the equations are the angular frequency with the maximum switch voltage stress Vs and the angular frequency with the maximum switch current stress Is respectively. The symbol φ(D) is the phase-shift angle with the variable duty cycle D. The equations are shown as following (10)~(12):

$$\varphi(D) := \operatorname{atan}\left[\frac{\cos(2\pi \cdot D) - 1}{2\pi \cdot (1-D) + \sin(2\pi \cdot D)}\right] + \pi \bigg| D := 0 \sim 1 \quad (10)$$

$$\omega_v(D) := \operatorname{asin}\left[\frac{\cos(2\pi D + \varphi(D)) - \cos(\varphi(D))}{2\pi(1-D)}\right] - \varphi(D) + 2\pi \quad (11)$$

$$\omega_i(D) := \frac{3}{2}\pi - \varphi(D) \quad (12)$$

According to the equations (8)~(12), the per unit switch voltage stress Vnor and the per unit switch current stress Inor can be calculated. According to the per unit switch voltage stress Vnor and the per unit switch current stress Inor, the power efficiency Pc is calculated. The equation is shown as following (13):

$$Pc := \frac{Pout}{Virf \cdot Vnor(D) \cdot Ii \cdot Inor(D)} \quad (13)$$

According to the per unit switch voltage stress Vnor, the per unit switch current stress Inor and the power efficiency Pc, a first curve graph can be made.

Figure 4A:
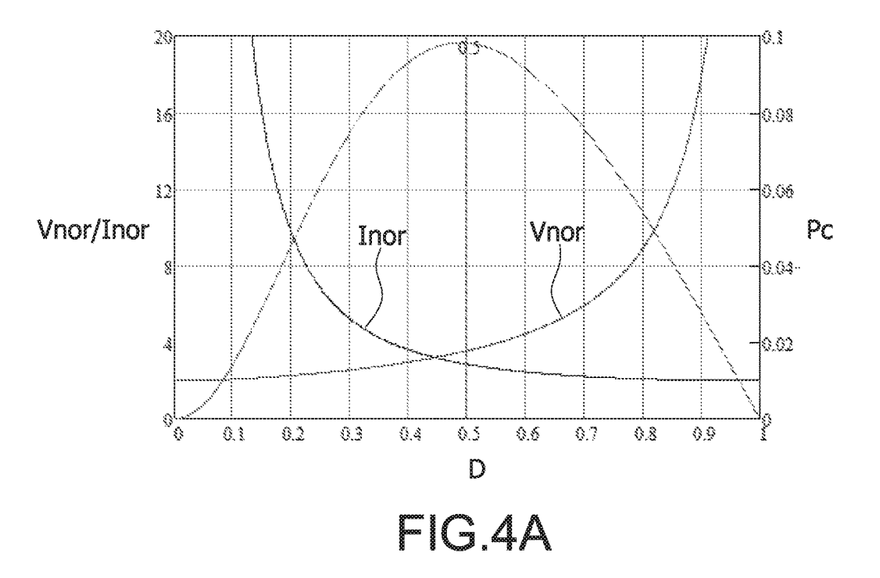
FIG. 4A shows the first curve graph of the present invention.

FIG. 4A shows the first curve graph of the present invention. Please refer to FIG. 2 and FIG. 3 again. The first curve graph shows that a per unit switch stress Snor (voltage Vnor/current Inor) of the radio-frequency amplifier 30 corresponding to the power efficiency Pc. According to the equations (2)~(7) mentioned above, the operation unit obtains the switch stress Ss of the power switch S of the radio-frequency amplifier 30 in the circuit design of the present invention. According to the equations (8)~(13) mentioned above, the switch stress Ss of the power switch S is converted into the per unit switch stress Snor and the first curve graph is made. According to the first curve graph, in the situation that the power efficiency Pc is high, the power switch S meeting the range of the switch stress Ss can be selected. Then, the efficiency of the radio-frequency amplifier is calculated according to the set of the predetermined parameters and the total circuit parameter. A second curve graph is made according to the duty cycle corresponding to the efficiency of the radio-frequency amplifier (S400). According to the set of the predetermined parameters P and the total circuit parameter Pc, the operation unit calculates a total loop current It of the radio-frequency amplifier 30, wherein the total loop current It is a flowing current when the loop is conducting. A total power loss Pt is calculated according to the total loop current It, wherein the total power loss Pt is the conduction loss when the loop is conducting. The total loop current It comprises the current of the input loop 31 and the current of the output loop 32. The equations are shown as following (14)~(17):

$$Isd(D) := Ii \cdot \sqrt{2 - D + \frac{2\pi(1-D)^2 \cdot \left[\pi D + \frac{1}{4}(\sin(2\varphi(D)) - \sin(4\pi D + 2\varphi(D)))\right]}{(\cos(2\pi D + \varphi(D)) - \cos(\varphi(D)))^2}} \quad (14)$$

$$Ic(D) := Ii \cdot \sqrt{D - 1 + \frac{2\pi(1-D)^2 \cdot \left[\pi(1-D) + \frac{1}{4}\begin{pmatrix}\sin(4\pi D + 2\varphi(D)) - \\ \sin(2\varphi(D))\end{pmatrix}\right]}{(\cos(2\pi D + \varphi(D)) - \cos(\varphi(D)))^2}} \quad (15)$$

$$Im(D) := Ii \cdot \frac{2\pi \cdot (1-D)}{\cos(2\pi D + \varphi(D)) - \cos(\varphi(D))} \quad (16)$$

$$Ili(D) := \frac{Vi}{Rdc(D)} \quad (17)$$

Wherein in the equations, the symbol Isd(D) is the current flowing through the drain to the source of the power switch S when the loop is conducting. The symbol Isd(D) is the current flowing through the output capacitor Co when the loop is conducting. The symbol Ili(D) is the current flowing through the input inductor Lin when the loop is conducting. The symbol Im(D) is the current flowing through the resonant inductor L and the resonant capacitor C when the loop is conducting. The symbol Rdc is the input impedance. According to the capacitance of the output capacitor Co and the duty cycle D, the input impedance is calculated and obtained. The equation is shown as following (18):

$$Rdc := \frac{(1-D)}{\omega \cdot Co} \cdot \frac{\pi(1-D) \cdot \cos(\pi D) + \sin(\pi D)}{\tan(\pi D + \varphi) \cdot \sin(\pi D)} \quad (18)$$

After the total loop current It is obtained according to the equations (14)~(17) mentioned above, the total power loss Pt is calculated according to the total loop current It. By calculating the power loss of the overall components of the radio-frequency amplifier 30, the efficiency of the radio-frequency amplifier 30 is obtained. The total power loss Pt is mainly the power consumption of the parasitic resistances of the components when the loop of the radio-frequency amplifier 30 is conducting. The total power loss Pt comprises a power loss of the power switch S, a power loss of the output capacitor Co, a power loss of the resonant unit 321 and a power loss of the input inductor Lin. The equation is shown as following (19):

$$Pt := Isd(D)^2 \cdot Rds + Ic(D)^2 \cdot Ro + Im(D)^2 \cdot Im(D)^2 \cdot Rc + Ili(D)^2 \cdot Rli \quad (19)$$

Wherein the symbol Rds in the equation is the parasitic resistance of the power switch S. The symbol Ro is the parasitic resistance of the output capacitor Co. The symbol Rl is the parasitic resistance of the resonant inductor L. The symbol Rc is the parasitic resistance of the resonant capacitor C. The symbol Rli is the parasitic resistance of the input inductor Lin. According to the equations (14)~(19) mentioned above, an inductance of the resonant inductor L, a capacitance of the resonant capacitor C and an inductance of the input inductor Lin can be selected to obtain the maximum power output of the radio-frequency amplifier 30.

Moreover, according to the equations (14)~(19) mentioned above and the calculation method of the components values of the related art radio-frequency amplifier 30, the input inductor Lin and the resonant unit 321 are selected and obtained. This would be omitted here for brevity. After the total power loss Pt is obtained according to the equation (18) mentioned above, the overall efficiency of the radio-frequency amplifier 30 is calculated according to the total power loss Pt. The equation is shown as following (20):

$$\eta := \frac{Po}{Po + Pt} \cdot 100\% \tag{20}$$

From the equation (1) mentioned above, if the switch stress Ss is less, the power efficiency Pc is higher. If the power efficiency Pc is less and the power switch S having the same product of the withstanding voltage and the withstanding current is used, on the premise of not damaging the switch, the output watts of the radio-frequency amplifier 30 is less.

Figure 4B:
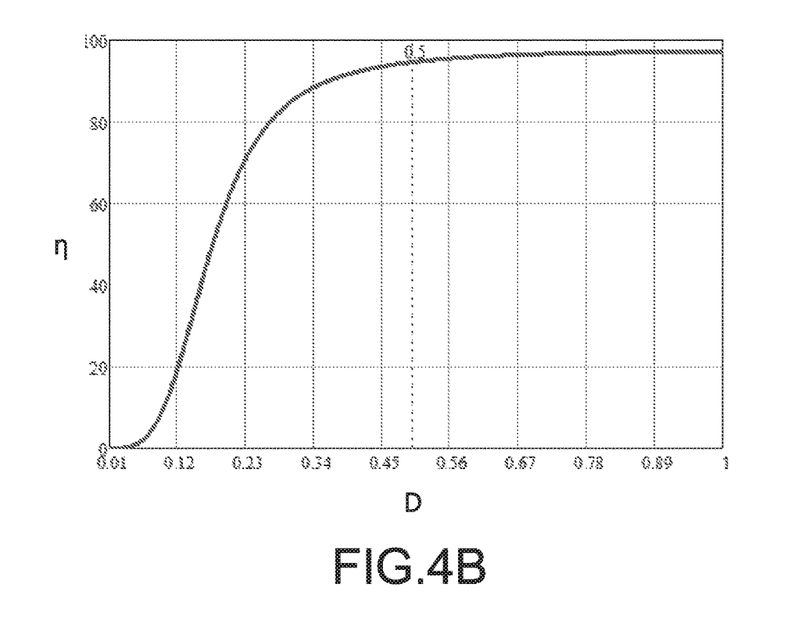
FIG. 4B shows the second curve graph of the present invention.

FIG. 4B shows the second curve graph of the present invention. Please refer to FIGS. 2~4A again. The second curve graph is an efficiency graph of the radio-frequency amplifier 30. From the equations (14)~(20) mentioned above, the overall efficiency of the radio-frequency amplifier 30 can be obtained. And according to the efficiency variation in the variable duty cycle D, the second curve graph is drawn. Then, a value of the duty cycle is selected according to the first curve graph. And the corresponding efficiency is obtained according to the second curve graph (S500). According to the first curve graph, the duty cycle D suitable for the power switch S of the radio-frequency amplifier 30 is selected as the value Dv of the duty cycle D. And in accordance with the second curve graph, the efficiency when being applied to the value Dv of the duty cycle D is obtained. Then, whether the efficiency is within a predetermined range or not is checked (S600). After the process goes through the steps (S100)~(S500), the parameters of all components of the input loop 31 and the output loop 32 of the radio-frequency amplifier 30 can be determined, so that whether the efficiency of the radio-frequency amplifier 30 is within a predetermined range Rp or not when operating has to be practically verified. Moreover, the predetermined range Rp comprises an efficiency predetermined value, a total harmonic distortion predetermined value and a predetermined cooling capacity. The main purpose for practically verifying is to verify whether the efficiency of the radio-frequency amplifier 30 is above the efficiency predetermined value or not. Finally, whether a total harmonic distortion and a cooling capacity are within the predetermined range or not are checked (S700). After the efficiency of the radio-frequency amplifier 30 when operating is ensured to be within the predetermined range Rp by the step (S600) mentioned above, whether the total harmonic distortion and the cooling capacity of the radio-frequency amplifier 30 when operating is below the total harmonic distortion predetermined value and achieves the predetermined cooling capacity of the predetermined range Rp or not respectively are checked as well. Finally, the value of the duty cycle is selected as the duty cycle of the power switch (S800). If the efficiency of the radio-frequency amplifier 30, the total harmonic distortion and the cooling capacity are within the predetermined range Rp, the value Dv of the duty cycle D is selected as the duty cycle D of the power switch S of the radio-frequency amplifier 30. Moreover, both steps (S600) and (S700) are steps for practically verifying the radio-frequency amplifier 30. Therefore, according to the practical requirement, the order of the steps (S600) and (S700) can be switched.

Please refer to FIG. 3 again, and please refer to FIG. 2 and FIG. 4. In the steps (S600) and (S700), the efficiency of the radio-frequency amplifier 30, the total harmonic distortion and the cooling capacity have to be ensured to be within the predetermined range Rp to achieve the circuit design process of the radio-frequency amplifier 30. Moreover, the predetermined range Rp is to set that the efficiency of the radio-frequency amplifier 30 has to be greater than 90% to achieve the efficiency of optimizing the overall efficiency of the radio-frequency amplifier 30. And in order to achieve the standard of the product safety of the radio-frequency power supply or radio-frequency amplifier, the predetermined range Rp is to further set that the total harmonic distortion has to be less than 10%, and the overall temperature of the radio-frequency amplifier 30 when operating cannot exceed 65° C. By selecting the power switch S and the duty cycle D according to the steps (S100)~(S700) mentioned above, the efficiency of the radio-frequency amplifier 30 can be improved efficiently. And with the proper switch stress Ss of the power switch S, the power switch S is not damaged easily in the operation of the radio-frequency amplifier 30. Moreover, most of the related art radio-frequency amplifiers 30 are to directly set the duty cycle as 0.5 for adjustment. The highest overall efficiency usually can be maintained only at 80%. However, this embodiment is designed by the steps (S100)~(S700) mentioned above, so comparing with the related art radio-frequency amplifier 30, the overall efficiency of the radio-frequency amplifier 30 of the present invention can be increased up by more than 10%.

Please refer to FIG. 3 again, and please refer to FIG. 2 and FIG. 4. In the steps (S600) and (S700), if the efficiency of the radio-frequency amplifier 30, the total harmonic distortion and/or the cooling capacity are determined and are not within the predetermined range Rp, the process goes to the step (900). The step (900) is changing (namely, adjusting) the input voltage or the duty cycle. When the efficiency of the radio-frequency amplifier 30, the total harmonic distortion and/or the cooling capacity are not within the predetermined range Rp, it means that there is an error between steps (S100)~(S400) and step (S500) which practically verifies the radio-frequency amplifier 30. Therefore, the input voltage Virf or the duty cycle D is adjusted, and the steps (S100)~(S700) are repeated until the efficiency of the radio-frequency amplifier 30, the total harmonic distortion and the cooling capacity are within the predetermined range Rp. Moreover, the equations (2)~(20) mentioned above are to obtain the required circuit parameters, so that the calculation method of the circuit parameters are not limited to the equations (2)~(19) mentioned above. In another word, no matter the calculation equations are the same as the equations (2)~(20) mentioned above or not, as long as the steps for improving the overall operation efficiency of the radio-frequency amplifier 30 according with the process of FIG. 3 of the present invention should be included in the embodiment of the present invention. Moreover, in this embodiment, the operation unit is, for example but not limited to, a computer. In another word, any operation unit that can perform parameter processing, operation and transmission functions should be included in the embodiment of the present invention.

Figure 5:
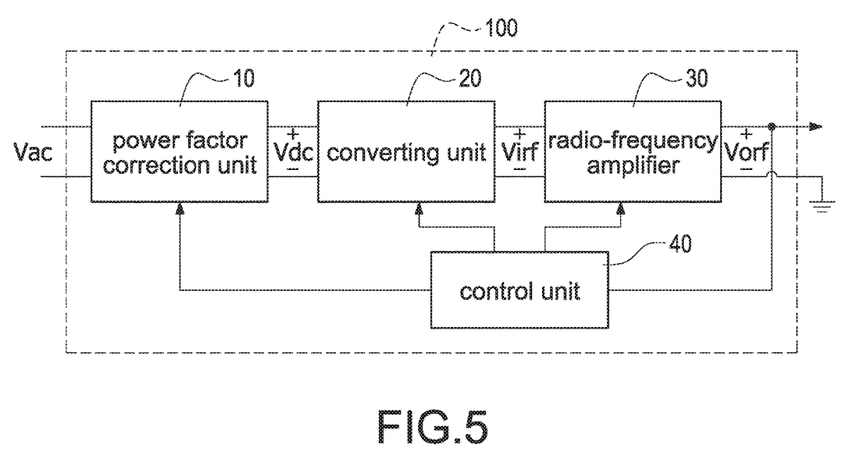
FIG. 5 shows a block diagram of the radio-frequency power supply of the present invention.

FIG. 5 shows a block diagram of the radio-frequency power supply of the present invention. Please refer to FIG. 2 and FIG. 3. The radio-frequency power supply 100 comprises a power factor correction unit 10, a converting unit 20, a radio-frequency amplifier 30 and a control unit 40. The converting unit 20 is connected between the power factor correction unit 10 and the radio-frequency amplifier 30. The control unit 40 controls the power factor correction unit 10, the converting unit 20 and the radio-frequency amplifier 30. The power factor correction unit 10 receives an alternating current input voltage Vac and converts the alternating current input voltage Vac into a direct current voltage Vdc. The converting unit 20 receives the direct current voltage Vdc and converts the direct current voltage Vdc into an input voltage Virf, wherein the input voltage Virf is a direct current voltage. The radio-frequency amplifier 30 receives the input voltage Virf and converts the input voltage Virf into an output voltage Vorf, wherein the output voltage Vorf is an alternating current energy. The control unit 40 receives the output voltage Vorf and outputs a control signal to adjust the power factor correction unit 10, the converting unit 20 and the radio-frequency amplifier 30. After the duty cycle D of the power switch S is determined by the circuit design steps (S100)~(S800) mentioned above, it means that the input voltage Virf or the duty cycle D does not have to be changed by the step (S900), and then the process returns to step (S100). Therefore, the input voltage Virf in accordance with the duty cycle D of the power switch S is selected as the input voltage Virf of the radio-frequency amplifier 30. And because the circuit design steps (S100)~(S500) of the present invention adjust the input voltage Virf of the radio-frequency amplifier 30, the input voltage Virf is not a fixed value. Therefore, after the radio-frequency amplifier 30 is designed by the steps (S100)~(S500), the converting unit 20 adjusts the voltage conversion ratio of the converting unit 20 according to the input voltage Virf. For example but not limited to, if the direct current voltage Vdc of the converting unit 20 is 300V and the input voltage Virf is confirmed as 150V according to the steps (S100)~(S500), the voltage conversion ratio of the converting unit 20 has to be adjusted as 2:1, so that the converting unit 20 can convert the 300V direct current voltage Vdc into 150V input voltage Virf.

Moreover, in this embodiment, the converting unit 20 is a direct-current-to-direct-current converter, but the kind of the direct-current-to-direct-current converter is not limited. Therefore, any direct-current-to-direct-current converter which can convert the direct current voltage Vdc into the input voltage Virf having the direct current energy should be included in the embodiment of the present invention. Moreover, in this embodiment, the power factor correction unit 10 can be an active power factor corrector or a passive power factor corrector, and corrects the overall power factor of the radio-frequency power supply 100, but the kind of the power factor corrector is not limited. Therefore, any power factor corrector which can correct the power factor should be included in the embodiment of the present invention.

In conclusion, the present invention comprises following advantages:

1. An effective circuit design process for the class E radio-frequency amplifier is provided. Comparing to the related art trial-and-error method, the present invention utilizes the process shown in FIG. 3 to reduce the time for adjusting the parameters of the power switch and the circuit components to achieve the efficiency of easily designing the radio-frequency amplifier 30 and the radio-frequency power supply 100 which are applied to the medium-high power (100~3000 W) and which can maintain high efficiency.

2. The power switch suitable for the class E radio-frequency amplifier is selected easily. Utilizing the process shown in FIG. 3, the switch stress graph and efficiency graph are obtained, and the optimal duty cycle D and the most suitable power switch S are found to achieve the efficiency that the power switch S is not damaged easily in the operation of the radio-frequency amplifier 30 with the switch stress Ss of the suitable power switch S.

3. The efficiency of the class E radio-frequency amplifier can be improved effectively. Comparing to the related art radio-frequency amplifier 30, the present invention utilizes the process shown in FIG. 3 to achieve the efficiency that the efficiency of the radio-frequency amplifier 30 is increased up to 90% and above.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A method for improving an efficiency of a radio-frequency amplifier, the radio-frequency amplifier comprising an input loop and an output loop, the input loop comprising an input inductor and a power switch, the input inductor connected to the power switch in series, the output loop comprising an output capacitor and a resonant unit, the output capacitor connected to the resonant unit in series, the power switch connected to the output capacitor in parallel and converting an input voltage into an output voltage, the method comprising:

(a) setting a set of predetermined parameters, wherein the set of the predetermined parameters comprises an output power of the radio-frequency amplifier, the input voltage, an operation frequency and a duty cycle;

(b) calculating a total circuit parameter according to the set of the predetermined parameters;

(c) calculating a switch stress of the power switch according to the set of the predetermined parameters and the calculated total circuit parameter;

(d) calculating the efficiency of the radio-frequency amplifier according to the set of the predetermined parameters and the calculated total circuit parameter; and (e) checking whether the efficiency of the radio-frequency amplifier is within a predetermined range or not, wherein if the efficiency of the radio-frequency amplifier is not within the predetermined range, the input voltage or the duty cycle of the set of the predetermined parameters is adjusted, and then the method returns to the step (a); if the efficiency of the radio-frequency amplifier is within the predetermined range, a value of the duty cycle is selected as a duty cycle of the power switch of the radio-frequency amplifier.

2. The method in claim 1, wherein the step (c) further comprises:

(c1) making a first curve graph according to the duty cycle corresponding to the switch stress.

3. The method in claim 2, wherein the step (d) further comprises:

(d1) making a second curve graph according to the duty cycle corresponding to the efficiency of the radio-frequency amplifier.

4. The method in claim 3 further comprising after the step (d1):

(d2) selecting the value of the duty cycle according to the first curve graph; obtaining the efficiency of the radio-frequency amplifier corresponding to the value of the duty cycle according to the second curve graph.

5. The method in claim 1, wherein the step (e) further comprises:
(e1) checking whether a total harmonic distortion and a cooling capacity of the radio-frequency amplifier are within the predetermined range or not, wherein if the total harmonic distortion or the cooling capacity of the radio-frequency amplifier is not within the predetermined range, the input voltage or the duty cycle of the set of the predetermined parameters is adjusted, and then the method returns to the step (a); if the total harmonic distortion and the cooling capacity of the radio-frequency amplifier are within the predetermined range, the value of the duty cycle is selected as the duty cycle of the power switch of the radio-frequency amplifier.

6. The method in claim 1, wherein the calculated total circuit parameter comprises a phase-shift angle of the radio-frequency amplifier, an electric capacity of the output capacitor, an input current of the radio-frequency amplifier and a resonant current of the resonant unit.

7. The method in claim 1, wherein the step (d) further comprises:
(d2) calculating a total power loss of the radio-frequency amplifier according to the set of the predetermined parameters and the calculated total circuit parameter; calculating the efficiency of the radio-frequency amplifier according to the total power loss, wherein the efficiency of the radio-frequency amplifier is equal to a ration of a power output of the radio-frequency amplifier relative to an overall power consumption of the radio-frequency amplifier.

8. The method in claim 7, wherein the resonant unit comprises a resonant capacitor and a resonant inductor; the resonant capacitor is connected to the resonant inductor in series; the step (d) further comprises:
(d3) selecting an inductance of the input inductor, a capacitance of the resonant capacitor and an inductance of the resonant inductor according to the total power loss.

9. The method in claim 1, wherein the switch stress comprises a switch voltage stress and a switch current stress.

10. The method in claim 9, wherein the step (c) further comprises:
(c2) selecting the power switch according to the switch voltage stress and the switch current stress.

11. The method in claim 1, wherein the total power loss comprises a power loss of the power switch, a power loss of the output capacitor, a power loss of the resonant unit and a power loss of the input inductor.

12. A radio-frequency amplifier comprising:
an input loop comprising an input inductor and a power switch, the input inductor connected to the power switch in series and receiving an input voltage; and
an output loop comprising an output capacitor and a resonant unit, the output capacitor connected to the power switch in parallel, the resonant unit connected to the output capacitor in series and outputting an output voltage,
wherein a duty cycle of the power switch of the radio-frequency amplifier is determined by the method in claim 1.

13. The radio-frequency amplifier in claim 12, wherein the input voltage of the radio-frequency amplifier is the input voltage corresponding to the duty cycle of the power switch.

14. A radio-frequency power supply comprising:
a power factor correction unit converting an alternating current input voltage into a direct current voltage;
a converting unit connected to the power factor correction unit and converting the direct current voltage into an input voltage;
a radio-frequency amplifier connected to the converting unit and converting the input voltage into an output voltage; and
a control unit controlling the power factor correction unit, the converting unit and the radio-frequency amplifier,
wherein the radio-frequency amplifier comprises an input loop and an output loop; the input loop comprises an input inductor and a power switch; the input inductor is connected to the power switch in series; the output loop comprises an output capacitor and a resonant unit; the output capacitor is connected to the resonant unit in series; the power switch is connected to the output capacitor in parallel; a duty cycle of the power switch of the radio-frequency amplifier is determined by the method in claim 1.

15. The radio-frequency power supply in claim 14, wherein the input voltage of the radio-frequency amplifier is the input voltage corresponding to the duty cycle of the power switch.

16. The radio-frequency power supply in claim 15, wherein a voltage conversion ratio of the converting unit is adjusted according to the input voltage.

* * * * *